United States Patent [19]

Pfleiderer

[11] 4,246,553
[45] Jan. 20, 1981

[54] INTEGRATED FILTER CIRCUIT

[75] Inventor: Hans-Jöerg Pfleiderer, Zorneding, Fed. Rep. of Germany

[73] Assignee: Siemens Aktiengesellschaft, Berlin & Munich, Fed. Rep. of Germany

[21] Appl. No.: 51,118

[22] Filed: Jun. 22, 1979

[30] Foreign Application Priority Data

Aug. 31, 1978 [DE] Fed. Rep. of Germany ....... 2838096

[51] Int. Cl.³ ............................................. H03H 15/02
[52] U.S. Cl. ..................................... 333/165; 333/166
[58] Field of Search ............................... 333/165, 166; 307/221 D

[56] References Cited

PUBLICATIONS

Caves et al., IEEE Journal of Solid–State Circuits, vol. SC-12, No. 6, Dec. 1977, pp. 609-616.
Knauer et al., Siemens-Forschungs-V. Entwicklungsberichten, vol. 7, No. 3, 1978 pp. 138-142.
Sequin, IEEE Journal of Solid State Circuits, vol. SC-12, No. 6, Dec., 1977, pp. 592-599.

*Primary Examiner*—Eli Lieberman
*Attorney, Agent, or Firm*—Hill, Van Santen, Steadman, Chiara & Simpson

[57] ABSTRACT

This invention relates to an integrated filter circuit with a charge transfer device transversal filter and a further low-pass filter pre-connected to the transversal filter. The pre-connected filter includes a first capacitor and a second, significantly smaller capacitor, as well as two alternately actuable electronic switches.

11 Claims, 5 Drawing Figures

INTEGRATED FILTER CIRCUIT

INTRODUCTION

The invention relates to an integrated filter circuit having a charge transfer device and a transversal filter.

BACKGROUND OF THE INVENTION

The periodic, time-discrete scanning undertaken in every transversal filter of the signals pending on the input side leads to disruptions which can be attributed thereto that input-side interference signals whose frequency is different from that of the frequency range of the use signal to be filtered by the interval of the clock pulse frequency of the transversal filter or a multiple thereof are transmitted to the output of the filter and effect a falsification of the filter output signal. In order to counter this influence, which is designated in the English language as "aliasing", a low pass filter may be connected to the input of the transversal filter, which low pass largerly attenuates the frequency ranges determined by means of the clock pulse frequency and its harmonic oscillations in which transmissions of such interference signals occur.

Thereby, however, it is disadvantageous that RC series low passes which, for example, are mentioned for this purpose in the article "Antialiasing Inputs for Charge-Coupled Devices" by C. H. Sequin in the IEEE Journal of Solid State Circuits, Vol. SC-12, No. 6, Dec. 1977, pages 609 through 616, particularly page 609, right-hand column, last paragraph, are not realizable without further ado in intergrated circuit technology when limiting frequencies in the range of a few kHz are strived for. Since the upper limit for capacitances which are to be manufactured in integrated circuit technology and are to be arranged together with the CTD transversal filter on a chip generally lies at a few pF, precise filter resistances in the magnitude of GΩ must be employed in order to achieve such limiting frequencies.

SUMMARY OF THE INVENTION

The object of the present invention is to provide a filter circuit of the type initially referred to, which can be realized simply and space-savingly even given relatively low values of the limiting frequency of the series filter. This is achieved according to the invention as herein described by the means hereinafter described.

The advantage attainable with the invention particularly lies in the fact that the series filter is monolithically integratable with the CTD transversal filter in a simple and cost-saving manner and in that, given a low requirement of semiconductor surface, values of the limiting frequency are attainable which lie at a few kHz.

BRIEF DESCRIPTION OF THE DRAWINGS

The invention is explained in greater detail on the basis of the drawings, in which.

DESCRIPTION OF THE PREFERRED EMBODIMENTS

Figure 1:
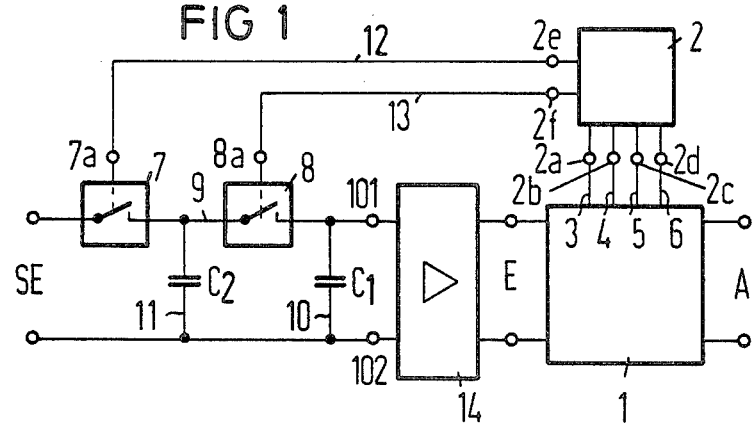
FIG. 1 is a basic representation of a preferred embodiment of the invention.

In FIG. 1, the block 1 represents a CTD transversal filter known per se, as is described, for example, in the book by Sequin and Tompsett "Charge Transfer Devices", Academic Press, New York, 1975, pages 216 through 232. Other embodiments of CTD transversal filters which are likewise to be understood as being included here, may be derived from the article "CTD-Transversal Filter with Parallel-In/Serial-Out Configuration" by K. Knauer, H.-J. Pfleiderer and H. Keller in the Siemens-Forschungs- and Entwicklungs-Berichten, Vol. 7, 1978, No. 3, pages 1 through 5. The signal input to the transversal filter is referenced with E, the filter output is referenced with A. A clock pulse voltage generator 2 exhibits outputs 2a through 2d, at which clock pulse voltages $\phi_1$ through $\phi_4$ which are of equal frequency but phase-displaced with respect to one another can be tapped. The clock pulse voltages are supplied via lines 3 through 6 in a traditional manner to the transfer electrodes of a charge transfer device (CTD), which is not illustrated in detail, although it represents a significant component part of the transversal filter 1.

A further filter designed as a low pass filter is provided between a circuit input reference SE and the input E of the CTD transversal filter 1, which further filter includes a first capacitor $C_1$, a second, significantly smaller capacitor $C_2$ and two alternatively actuatable electronic switches 7 and 8. Thereby, these circuit elements are gathered together to form a four-pole circuit whose input coincides with the circuit input SE and whose output is formed by means of the circuit points 101 and 102. The switches 7 and 8 are provided in series with one another in the series arm 9 of this four-pole circuit, whereas the first capacitor $C_1$ is inserted in an output-side shunt arm 10 and the second capacitor $C_2$ is inserted in a shunt arm 11 connected between the switches 7 and 8.

The clock pulse voltage generator 2 exhibits further outputs 2e and 2f at which two clock pulse voltages which are of equal frequency and phase-displaced with respect to one another can be tapped, which clock pulse voltages are supplied to the control inputs 7a and 8a of the switches 7 and 8 via lines 12 and 13.

The four-pole circuit line between the circuit points SE, 101 and 102 is known per se from the "IEEE Journal of Solid State Circuits", Vol. SC-12, No. 6, Dec. 1977, pages 592 through 599, particularly FIGS. 1 and 2. As follows from a description of the said FIGS. 1 and 2 of this publication, upon an alternating actuation of the switches 7 and 8 whereby, first 7 is closed and 8 remains open whereas, subsequently, 7 is opened and 8 closes, there first occurs a charging of $C_2$ to the amplitude of a signal adjacent at SE, whereas, subsequently, the capacitors $C_1$ and $C_2$ are switched via the series arm 9 and the shunt arms 10 and 11 into a circuit in which they lie in series with one another, so that a partial transmission of the charge of $C_2$ to $C_1$ can follow.

Given the assumption that the capacitance of $C_1$ is significantly larger than that of $C_2$—for example, by a ratio of 100:1—and a periodic actuation of the switches 7 and 8 follows with a period T, the four-pole circuit simulates a RC low pass filter with an ohmic resistance R in the series arm 9 and the capacitor $C_1$ in the shunt arm 10, whereby the value of R corresponds to the quotient $T/C_2$. Thereby, the capacitance of the capacitor $C_2$ is to be understood by $C_2$. If one selects the period T at 1 μs, which corresponds to a clock pulse frequency of the clock pulse voltages supplied to the switches 7 and 8 of one MHz, and dimensions the capacitors $C_1$ and $C_2$ in such a manner that their capacitances are in a ratio of 100:1, then, given a capacitance of 0.1 pF for the capacitor $C_1$, there ensues an equivalent ohmic resistance of '10 MΩ in the series arm 9 of the four-pole circuit and a limiting frequency of approximately 1 kHz for the low pass filter. In a CTD transversal filter 1 which is operated with a clock pulse frequency of 16 kHz, that already represents a clear improvement of the filter properties with respect to the initially cited "aliasing" behavior.

If the input resistance of the transversal filter 1 is dimensioned high-resistant, then the circuit points 101 and 102 are directly connected to the filter input E. In general, however, it is expedient to insert an amplifier 14 with a high-resistant input resistance in between, as is indicated in FIG. 1.

Figure 2:
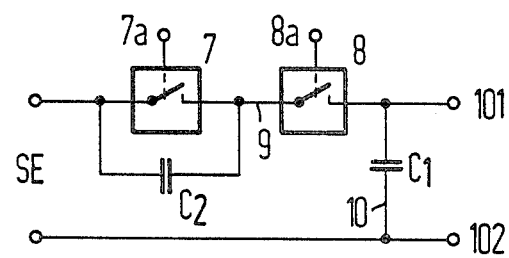
FIG. 2 is an alternative embodiment of a portion of the circuit of FIG. 1.

FIG. 2 shows another embodiment of the four-pole circuit which is to be employed in place of the one described in FIG. 1. The circuit parts and connection points already described on the basis of FIG. 1 are provided with the same reference symbols in FIG. 2. Differing from FIG. 1, the capacitor $C_2$ is now connected in parallel to the switch 7. Thus, in the first switching phase, in which the switch 7 is closed whereas the switch 8 remains open, there ensues a discharge of $C_2$ via the switch 7, whereas in the second switching phase (7 opened, 8 closed), a charging circuit for the series connection formed of $C_1$ and $C_2$ is created, whose connections SE lie at a voltage which is given by means of the amplitude value of an adjacent input signal. Given the precondition that $C_1$ exhibits a significantly greater capacitance than $C_2$, the relationship already described on the basis of FIG. 1 is valid, according to which the series arm 9 simulates an ohmic resistance whose value corresponds to the quotient $T/C_2$, whereby T represents the period of the clock pulse voltages actuating the switches 7 and 8, and $C_2$ indicates the capacitance of the capacitor $C_2$.

The susceptibility to interference of the integrated filter circuit according to the invention can be even more significantly reduced when, instead of a single four-pole circuit, a cascade circuit consisting of a plurality of such circuits of which each is augmented by means of an output-side amplifier with high input resistance is provided between the circuit input SE and the input E of the transversal filter of FIG. 1.

Figure 3:
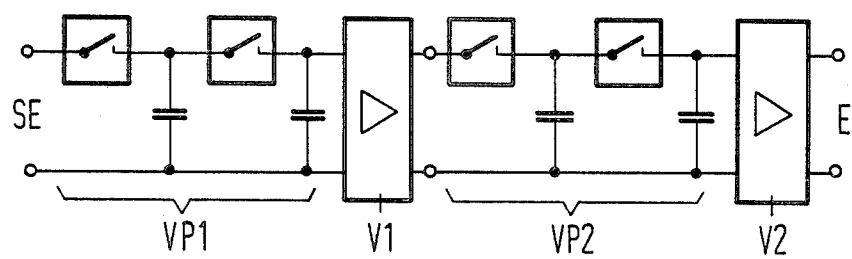
FIG. 3 is a further development of portion of the circuit of FIG. 1.

FIG. 3 illustrates a two-stage cascade circuit of this type, whereby the individual four-pole circuits are referenced VP1 and VP2, and the terminating amplifiers are referenced with V1 and V2. Of course, the four-poles VP1 and VP2 can also be designed according to FIG. 2.

Figure 4:
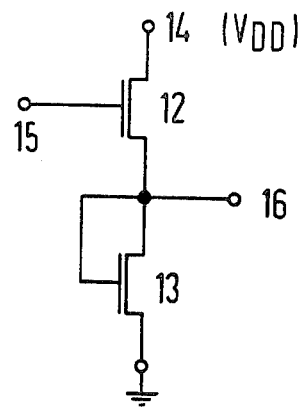
FIG. 4 illustrates a preferred embodiment of an amplifier circuit contained in FIGS. 1 and 3.

FIG. 4 shows a preferred embodiment of the amplifiers 14, V1 and V2, which is constructed as a source-follower-stage equipped with MIS field effect transistors. Thereby, the two field effect transistors 12 and 13 of the enhancement type are connected in series with their source-drain segments, whereby the drain connection of 12 is connected with a connection 14 carrying the supy voltage $V_{DD}$, whereas the source connection of 13 is switched with the grounded potential. The gate connection 15 of the transistor 12 forms the amplifier input, whereas the amplifier output 16 is applied to the source connection of the transistor 12. The gate connection of the transistor 13 representing a load element is connected with its drain connection.

Figure 5:
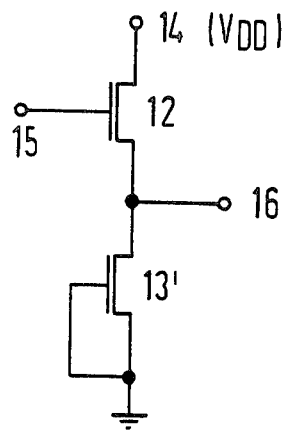
FIG. 5 shows a circuit variant of FIG. 4.

A circuit variant to FIG. 4 is shown in FIG. 5. Hereby, instead of transistor 13, a transistor 13' of the depletion type is provided whose gate is connected with its source connection in order to realize a load element.

The electronic switches 7 and 8 can be advantageously realized as field effect switching transistors, whose insulated gate electrodes are connected to the control inputs 7a and 8a. A particularly favorable and interference-free operating behavior is produced for the filter circuit according to the invention when the frequency of the clock pulse voltages supplied to the control inputs 7a and 8a represents a whole multiple of the frequency of the shift clock pulse voltages supplied to the CTD transversal filter.

It will be apparent to those skilled in the art that many modifications and variations may be effected without departing from the spirit and scope of the novel concepts of the present invention.

What I claim as my invention is:

1. Integrated filter circuit with a CTD transversal filter and a further low pass filter preconnected to the transversal filter, in which the preconnected filter includes a first capacitor, a second, significantly smaller capacitor, first and second alternatively actuatable electronic switches, a transfer circuit for said second capacitor leading over said first switch, and a transfer circuit for a series connection formed of said first and second capacitors leading over said second switch.

2. Filter circuit according to claim 1, in which said further filter consists of a four-pole in whose series arm both of said switches are arranged in series to one another; and in which said first capacitor is located in an output-side shunt arm and said second capacitor is located in a shunt arm arranged between said first and second switches.

3. Filter circuit according to claim 1, in which said further filter consists of a four-pole in whose series arm the second switch being arranged in series to a parallel connection consisting of said first switch and said second capacitor; and in that said first capacitor is inserted in an output-side shunt arm.

4. Filter circuit according to claim 3, in which said further filter includes an amplifier with high input resistance, whose input is connected in parallel to said first capacitor and whose output forms the output of said further filter.

5. Filter circuit according to claim 4, in which the input of said CTD transversal filter is connected with a cascade circuit consisting of a plurality of further filters having a plurality of amplifiers with high-resistant input resistances respectively arranged on the output side.

6. Filter circuit according to claim 5, in which said amplifier with high-resistant input resistance consists of a source-follower-stage constructed in MIS technology.

7. Filter circuit according to claim 1, which includes a clock pulse generator which has two outputs for two first clock pulse voltages phase-displaced with respect to one another, which are connected with control inputs of said electronic switches and which also has further outputs for four second clock pulse voltages having a lower frequency which serve for the operation of the CTD transversal filter.

8. Filter circuit according to claim 7, in which the frequency of said first clock pulse voltages is a whole multiple of the frequency of the second clock pulse voltages.

9. Filter circuit according to claim 2, in which said further filter includes an amplifier with high input resistance, whose input is connected in parallel to said first capacitor and whose output forms the output of said further filter.

10. Filter circuit according to claim 9, in which the input of said CTD transversal filter is connected with a cascade circuit consisting of a plurality of further filters having a plurality of amplifiers with high-resistant input resistances respectively arranged on the output side.

11. Filter circuit according to claim 10, in which said amplifier with high-resistant input resistance consists of a source-follower-stage constructed in MIS technology.

* * * * *